United States Patent
Devitt

(10) Patent No.: US 7,908,885 B2
(45) Date of Patent: Mar. 22, 2011

(54) NON-CONTACT POROUS AIR BEARING AND GLASS FLATTENING DEVICE

(75) Inventor: Andrew J. Devitt, Media, PA (US)

(73) Assignee: New Way Machine Components, Inc., Aston, PA (US)

(\*) Notice: Subject to any disclaimer, the term of this patent is extended or adjusted under 35 U.S.C. 154(b) by 1258 days.

(21) Appl. No.: 11/274,513

(22) Filed: Nov. 8, 2005

(65) Prior Publication Data

US 2006/0219605 A1 Oct. 5, 2006

Related U.S. Application Data

(60) Provisional application No. 60/625,583, filed on Nov. 8, 2004, provisional application No. 60/644,981, filed on Jan. 21, 2005.

(51) Int. Cl.
*C03B 23/035* (2006.01)
*C03B 35/00* (2006.01)
*C03B 35/14* (2006.01)
*C03B 35/22* (2006.01)
*C03B 35/24* (2006.01)

(52) U.S. Cl. .................. 65/106; 65/182.1; 65/182.2

(58) Field of Classification Search .................. 65/106, 65/182.1, 182.2, 182.3, 182.5; 209/37
See application file for complete search history.

(56) References Cited

U.S. PATENT DOCUMENTS

| | | | | |
|---|---|---|---|---|
| 3,341,313 | A | * | 9/1967 | Wheeler et al. .................. 65/104 |
| 3,374,078 | A | * | 3/1968 | Wright .......................... 65/182.2 |
| 4,186,918 | A | | 2/1980 | Ficker et al. |
| 4,618,292 | A | | 10/1986 | Judge et al. |
| 5,078,775 | A | | 1/1992 | Maltby, Jr. et al. |
| 5,246,331 | A | | 9/1993 | Hallahan et al. |
| 5,730,801 | A | | 3/1998 | Tepman et al. |
| 6,515,288 | B1 | | 2/2003 | Ryding et al. |
| 6,540,001 | B1 | | 4/2003 | McNestry |
| 6,644,703 | B1 | | 11/2003 | Levin et al. |
| 6,781,684 | B1 | | 8/2004 | Ekholff |
| 6,899,765 | B2 | | 5/2005 | Krivts et al. |
| 2003/0169524 | A1 | | 9/2003 | Adin et al. |
| 2003/0177790 | A1 | | 9/2003 | Langsdorf et al. |
| 2005/0103052 | A1 | * | 5/2005 | Minaai .......................... 65/43 |

FOREIGN PATENT DOCUMENTS

WO WO 03/060961 7/2003
WO WO 2004/079496 9/2004

\* cited by examiner

*Primary Examiner* — Matthew J Daniels
*Assistant Examiner* — Cynthia Szewczyk
(74) *Attorney, Agent, or Firm* — Blank Rome LLP

(57) ABSTRACT

Thin substrates, such as flat glass panels, are levitated on a porous media air bearing creating a pressurized film of air and preloaded against the air film by negative pressure areas. The pressure can be distributed most uniformly across the pressure areas by defusing the pressure through a porous medium. Such a bearing can be used for glass flattening by holding the glass such that the unevenness is migrated to the side opposite the side to be worked on.

4 Claims, 4 Drawing Sheets

NON-CONTACT POROUS AIR BEARING AND GLASS FLATTENING DEVICE

REFERENCE TO RELATED APPLICATIONS

The present application claims the benefit of U.S. Provisional Patent Application No. 60/625,583, filed Nov. 8, 2004, and U.S. Provisional Patent Application No. 60/644,981, filed Jan. 21, 2005, both of whose disclosures are hereby incorporated by reference in their entireties into to present disclosure.

FIELD OF THE INVENTION

The invention is directed to a system and method for supporting thin work pieces, particularly glass, for precision inspection, coating, patterning, and other processes without contacting the work piece.

DESCRIPTION OF RELATED ART

Flat-panel display (FPD) screens especially for computer and large screen televisions have pushed manufacturers to processing very large and thin glass substrates. As the substrates get larger they become more difficult to handle with robotic arms due to deflections of the glass from its own weight. A method for transporting glass on a cushion of air could eliminate many problems buy supporting the glass more uniformly without touching the glass. Most of the current efforts in this regard include air floatation tables employing orifices and compressed air from outside of the clean room. The cost involved in cleaning, drying and temperature controlling the compressed air is a very expensive cost of ownership issue. Also as these large glass sheets are predominantly processed in the horizontal plane, the supporting air nozzles or orifices create airflow geysers in competition with the natural down flow of the clean room air. Further, these jets of air create low-pressure around them attracting particulates which have settled on the support surface and sending them up on the geysers of air. It is then likely that these particulates will settle on to the workpiece surfaces, which is exactly what is to be avoided. These types of conveyors also suffer from the fact the glass is not naturally flat. Corners or edges may want to turn up or turn down, causing contact with the air table or vertical lift at higher speeds. More advanced systems use vacuum to hold glass flat against an array of pressurize orifices that are supplied with air by compressors from outside the room at pressures in excess of one atmosphere (14 psi).

A fundamental physical problem to be overcome stems from the low stiffness of the glass. It is simpler to generate vacuum and pressure forces by using continuous uninterrupted surface areas. Unfortunately this is likely to result in the distortion of the glass. To avoid this distortion it is best to put the alternating pressure and vacuum regions at a high frequency (pitch). The unfortunate thing on this side is that the air bearing pressure areas become inefficient on exponential curves as the lands get narrower thus requiring higher pressures to achieve the same lift height. This couples to the second derogatory effect which is that the flow through a gap is a cubic function of the gap. So pressures and flows go up as the period between vacuum and pressure is reduced.

One potential application for this technology is the handling and transporting of flat panel glass sheet during the manufacturing of flat-panel display screens. During this process it is desirable to move glass rapidly from point-to-point. The speed is limited by leading edges of the glass that may want to curl up away from the guidance. Up turning edges can send the glass airborne at high velocities, especially between vacuum ports as employed in prior art. This tendency to curl up or down may be from a natural stress in the glass or from additional coatings applied during the manufacturing process.

FPD glass has a natural 5 to 7 micron thickness variation as it is made, when it is sucked down to a flat vacuum chuck for processing, all 5 to 7 microns of thickness variation will appear as surface flatness error opposite the chuck side. By sucking the glass up by vacuum pressure to a non-contact air bearing chuck that is arrayed around an optical aperture, the flat side of the glass can be presented to the optics. This satisfies the requirement for shorter depth of field and enables higher resolution lithography while greatly minimizing the structural loop between the optics and the glass. The thickness variation error in the glass does not cause problems for conventional LCD manufacturing but it is becoming a limiting factor for higher resolution types of lithography that will be required for higher definition displays.

The prior art includes the following:

U.S. Pat. No. 6,781,684 Inventor: Ekhoff, Donald L This reference uses the structure to conduct pressure and vacuum to the various pressure and vacuum openings on the surface of the structure, which supports the air film, which supports the workpiece. The patent teaches a continuous uninterrupted surface. This uninterrupted surface interferes with the natural down flow of clean room environments this is further aggravated by having by having pressure orifices which amount to vertical air stream jets, which send particulates up against the natural down flow. This reference also employees raised regions with coplanar surfaces surrounding the exhaust ports. These raised regions acted as Pinch valves for self-regulating fly height purposes. Although this is a clever design there are significant problems with its application. As the edges and corners of the glass tend to blow up or down these raised regions present a vertical wall for the glass to hit against. A further disadvantage of this invention is that any particulate that may be present on the surface will be attracted to the gap between the raised planar surface around the exhaust port and the workpiece of interest being floated by the fact that the exhaust gas is being sucked through that gap. This is likely to cause backside damages and scratches to the workpiece. A further disadvantage is that the air pressure gap must be relatively thick (at least as thick as the raised areas) which results in the low stiffness of air film that will provide little resistance or damping to vertical vibrations. This means the glass will be more prone to chatter than a system operating on a thinner air film. The damping coefficient of an air film decreases as a cubic function of increases in the gap.

Published patent application no: US20030177790A1 Inventor: Langsdorf, Andreas; this reference has some similarities to the current invention with the important following differences. Namely this reference is concerned only with hot glass in the handling during the ceramic process. Although it does employ modular support beams, which conduct pressure through the interior of their structure, they are only claimed to conduct pressure. Most importantly Langsdorf does not claim for vacuum WIPO PCT WO2004/079496 Inventors: Shigeru, Yamamoto; Adin, Raanan Patent application number US 2003/0169524 A1 Filed: Dec. 27, 2002 Issued; Sep. 11, 2003 Inventors: Adin, Raanan; Yuval Yassour. Porous media air bearings are not in any definition orifice type bearings. There are well known and recognized classifications of air bearing types including; step, orifice and porous. The Ekhoff patent is analogous to step type compensation. Levin and Yuval patent is consistent with the orifice type but with the clever use of turbulent flow restriction in the orifice.

The Ekhoff patent filed Nov. 7, 2000 and issued Aug. 24, 2004 clearly claims for manufacturing and inspecting electronic circuits by using an air flotation system to translate the workpiece. It is interesting to note that the Adin, Yassour provisional patent application filed on Dec. 27, 2001 and issued on Sep. 11, 2003 also clearly claims for manufacturing and inspecting electronic circuits by using an air flotation system to translate the workpiece.

SUMMARY OF THE INVENTION

It is therefore a goal of the present invention to overcome the above-noted deficiencies of the prior art.

To achieve the above and other goals, the present invention is directed to a method for supporting and transporting thin substrates by levitating them on a porous media air bearing creating a pressurized film of air and preloading them against the air film by negative pressure areas. The pressure can be distributed most uniformly across the pressure areas by defusing the pressure through a porous media. Low-pressure regions can be holes or grooves connected via orifices to low-pressure chambers. These low-pressure chambers can be internal areas of structural tubing used to support the surface or plenums created by separation plates.

Using porous air bearing technology is novel in this area of art and has many advantages. First everywhere there is porous media bearing face, which in these embodiments is everywhere there is not a vacuum hole or grove, there is force pushing up. This becomes more intuitively obvious when a person actually presses with their finger on glass supported by a porous air bearing. Several pounds of force is required to ground the glass even with only 10 psi in put pressure, orifice bearings allow the glass to be grounded with only fractions of an ounce when pressed on between pressure nozzles as air will not naturally flow to an area of increased resistance and only ounces when pressed directly over a hole as the air expands immediately as it exits the nozzle, losing pressure. Additionally once the gap over the nozzle is reduced the pressure directly over the nozzle may increase but the effective area for the pressure to act becomes little more than the area of the hole in the nozzle. Additionally as the leading edge of the glass transits over the pressure nozzles there is a perturbation and the edge of the glass may curl down between the pressure nozzles. A porous media bearing face provides the leading edge of the glass with uniform pressure as in transits including right to the bitter edges of the bearing. A porous air bearing is silent and the low air flow can not be detected emanating from the surface by feel so it will not create vertical air streams, these are the reasons adaptive nozzles are used in some prior art.

The present invention is also directed to a technique for flattening glass. The common technique for holding large thin glass work pieces is to suck them down to a vacuum chuck the same size as the glass. In that method there are two main sources of flatness errors; the flatness of the chucks supporting the glass including any contamination which may be between the glass and the chucks and the thickness of the glass itself. By conveying the glass on a of film of air and employing precision zones adjacent to precision processes the cost and many of the problems associated with substrate sized vacuum chucks can be eliminated. A further advantage, and the subject of this patent application, is to design the precision zone so as to present the flattest possible surface for high-resolution lithography and or other precision processes.

By positioning the vacuum preloaded air bearing array on the same side as the processing, natural thickness errors in the glass or substrate can be removed or minimized for processing.

BRIEF DESCRIPTION OF THE DRAWINGS

Preferred embodiments of the invention will be set forth in detail with reference to the drawings, in which.

DETAILED DESCRIPTION OF THE PREFERRED EMBODIMENTS

Figure 1A:
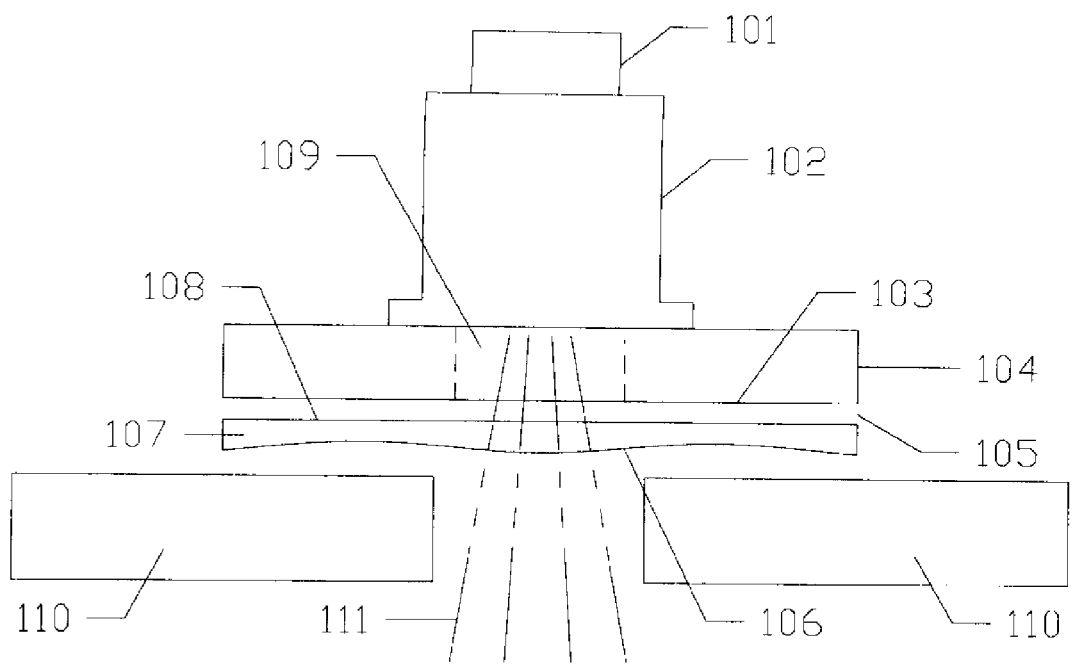
FIGS. 1A-1D show a glass flattening technique according to a preferred embodiment.

Various preferred embodiments of the invention will be set forth in detail with reference to the drawings, in which like reference numerals refer to like elements throughout.

A device is disclosed for supporting and transporting thin substrates by levitating them on a porous media air bearing creating a pressurized film of air and preloading them against the air film by negative pressure areas. The pressure can be distributed most uniformly across the pressure areas by defusing the pressure through a porous media. Since the entire top surface the conveyer or precision chuck has air pressure bleeding out the surface it is not dependant on flow though the gap to support an area of increased load. Another advantage of the porous media air bearing is that because the air escapes from the whole surface the velocity of the air is very low, eliminating vertical air streams. Vacuum regions can be holes or grooves connected via orifices to vacuum plenums within the conveyer or precision chuck. These vacuum plenums can be internal areas of structural tubing used to support the surface or tubing created by separation plates or plenums milled from solid stock. The fact that the conveyers and chucks can be manufactured from extrusion with internal plenums for various pressures reduces cost. Their modularity allows for separation between them so that the vertical down steam flow of clean room air may flow between them. They may be made from metal, ceramic (for high temp.), fiberglass, carbon fiber or plastics. It is convenient that the structures that support the conveyers may also be used as manifolds to conduct vacuum or high pressure air to the plenums of the conveyers. The porous media may be of graphite, carbon, ceramic, metal or plastic.

This embodiment results in the most consistent fly heights over the length of the bearing and the least distortion of the glass. Further it provides the most high stiffness areas and the highest average stiffness and damping. When this embodiment is from solid stock and bolted to a stable structure vertical stability of 0.7 mm glass can be less then +−1 nanometer while flying in an operational mode. It is also possible to employ this embodiment without ambient grooves.

Embodiments for glass flattening will now be described.

FIG. 1A is a representation of flattening the glass for a precision optical process by use of an array of vacuum preloaded air bearings; these bearings could be consistent with the previously disclosed air bearing conveyers or precision chucks. Because the vacuum force is significantly stronger then the bending force of the glass the vacuum force pulls the glass 107 against the air film 105, which has a relatively high stiffness and is supported in a flat plane by the face 103 of the air bearing array 104 which puts the flatness error on the opposite, lower 106 side of the glass. Gap is inversely proportional to stiffness; so small gaps have higher stiffness. We have found 15 to 35 microns fly height to be good compromise between manufacturing tolerances, safety against touchdowns and stiffness. Notice that the surface of the glass being processed has been flattened against the air film 105. A further advantage is not only does this invention flatten thickness variation within a single sheet, there may also be large thickness variation between different sheets but the distance between the optics and the surface of interest will always be the same. In previous art the distance between the optics and the surface of the glass being processed would have had to be physically adjusted because of the thickness change of the glass. Also, because much processing is done with some sort of a radiation 101, 102, 111 (light, laser, etc.), heat from this process can warm the glass 107 causing it to grow. Axial growth (in X and Y, not in thickness) is the main cause of position error. By holding the glass 107 over a precision chuck 142 and 162 as in FIGS. 1C and 1B, all of this radiation will be captured by the glass 107 or the chuck 142 and 162. In the case of a precision air bearing chuck as the heat can come back to the glass though radiation from the chuck or conductance though the air gap. In the case of conventional vacuum chucks there is physical contact between the glass and the chuck, as shown in FIG. 1D, so radiation that makes it though the glass will be absorbed into the chuck as heat which will affect the chuck's dimensional stability and the heat will be conducted into the glass though contact affecting it's dimensional stability even more. By guiding the glass 107, on the same side that is being processed by vacuum preloaded conveyor or precision air bearings as described in FIG. 1A the optical path though 109 and under the glass 111 and though conveyor 110 can be clear for a meter or more allowing excess radiation to take its heat away from the glass and areas of interest here, much of the radiation may flow through the glass 107 to some surface a meter or more away, preventing thermal problems.

Figure 1B:
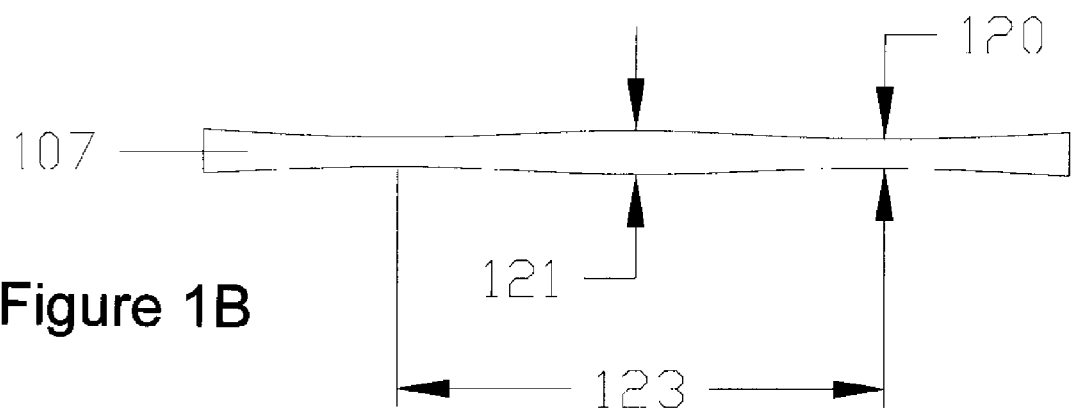

FIG. 1B depicts thickness variation in typical FPD sheets. Periods 123 between the glass 107 maximum 121 and minimum 120 thicknesses (the amplitude of this difference is about 5 to 7 microns) is on the order of 100 to 200 mm.

Figure 1C:
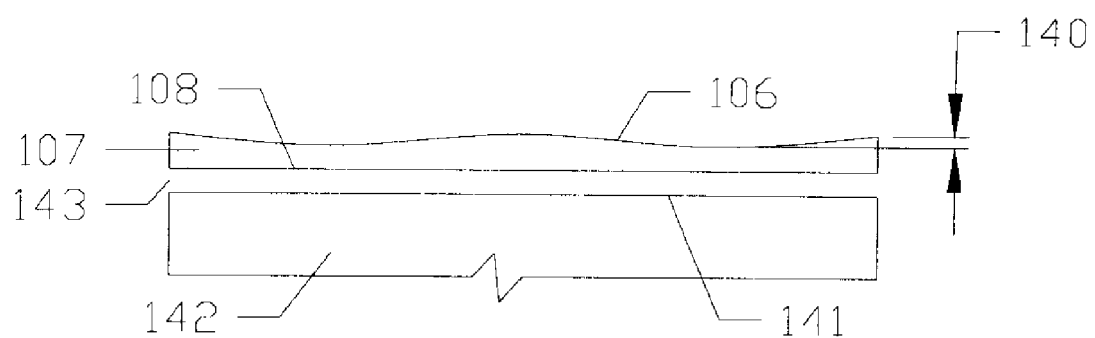
Figure 1D:
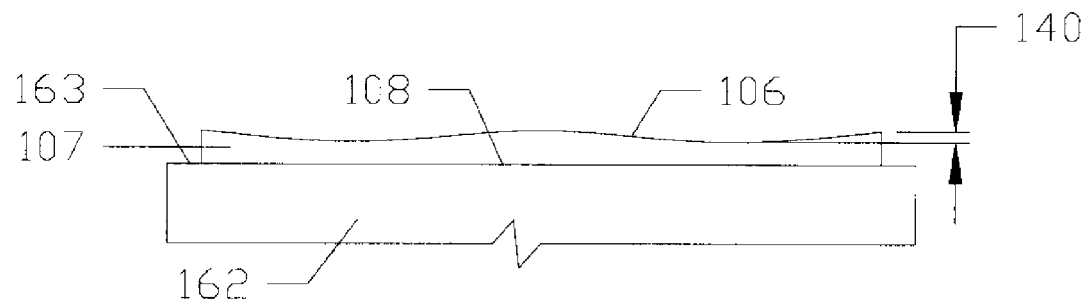

FIG. 1C depicts glass 107 flowing on an air film 143 over a precision air bearing chuck or conveyer 142 illustrating that the flat side of the glass 108 would be the side adjacent to the chuck face 141 and not the side available for processing from above 106. This puts the thickness error 140 disadvantageously on the process side.

FIG. 1D is an illustration of prior art, comprising a substrate sized vacuum chuck 162 with chuck face 163, which can be on the order 2 meters by 2 meters, to which the glass 107 is urged into physical contact by the higher ambient atmospheric pressure. Providing there is no contamination between the glass 107 and the chuck 162, the glass 107 will become flat on the chuck side 108. If there is contamination this will often damage the glass. The opposed side 106 that will be available for precision processes will have the total thickness error 140 as a flatness error. In the practice of conventional art the glass 107 is in contact with the chuck 162 as shown in 1D.

Figure 2:
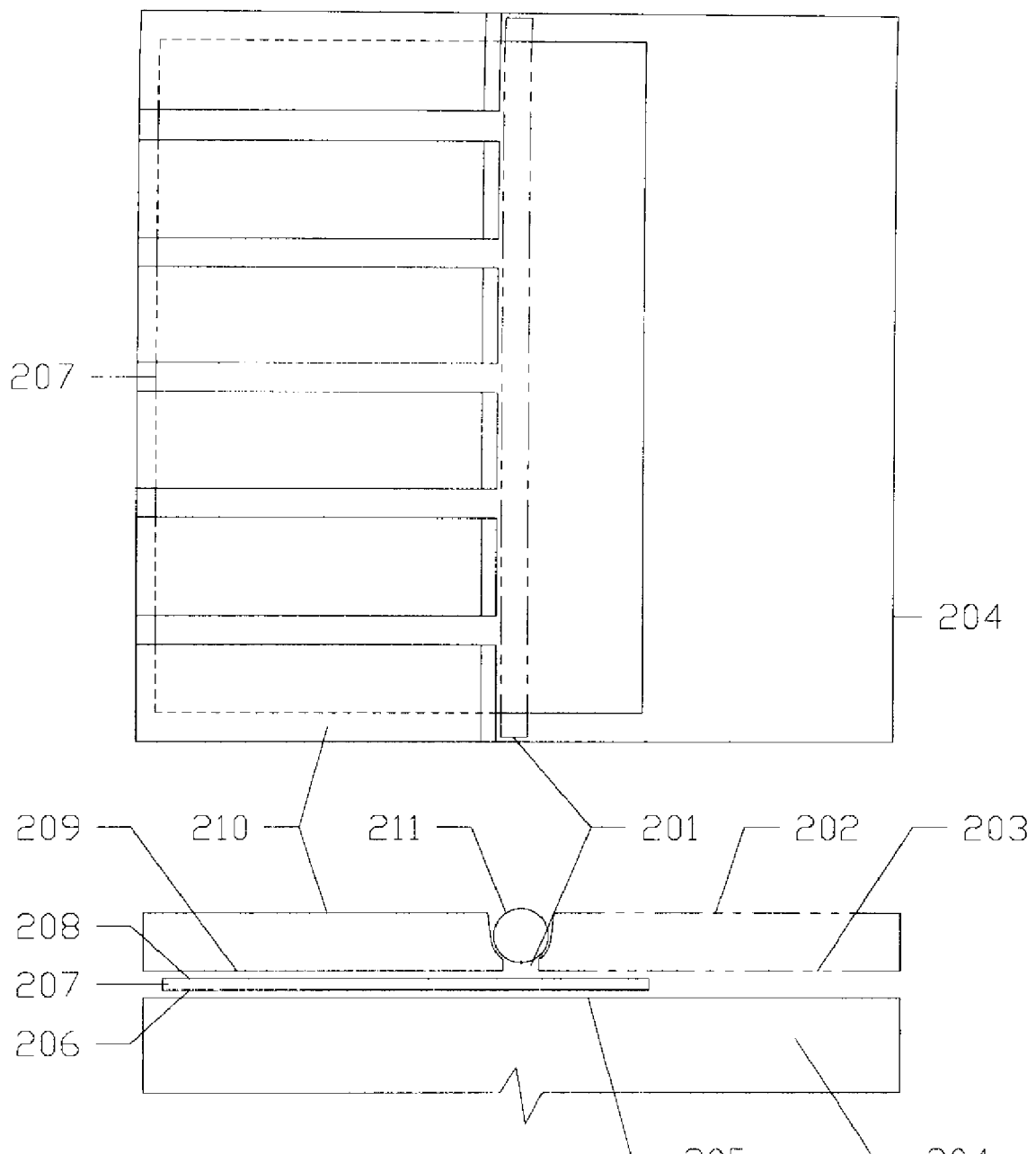
FIG. 2 shows another glass flattening embodiment.

FIG. 2 is an embodiment where the glass is also suspended from an air bearing vacuum preloaded precision chuck 210 with face 209. It flows off the chuck 210 into a long narrow precision area 201 orthogonal to the motion of the glass and appropriate for applying a coating from coating nozzle 211, or line inspection or exposure as examples. In the coating application the glass 207 after passing the precision area, would likely flow onto another precision chuck or conveyor air bearings 204 with face 205 that support the glass 207 from underneath, as it would not be advantageous to run air bearings on a freshly coated surface, although the glass 207 could flow onto a conveyor 202 with face 203 that continues to suspend the glass 207 from above as in inspection or exposure. In this case the vacuum functionality from the lower precision chuck 204 with face 205 would not be employed in the air gap 206. The vacuum functionality would be employed from precision chuck 202 and 210 through faces 203 and 209 drawing the substrate 207 against the air film 208. The conveyers 204 may have an aperture as described in FIG. 1A.

Figure 3:
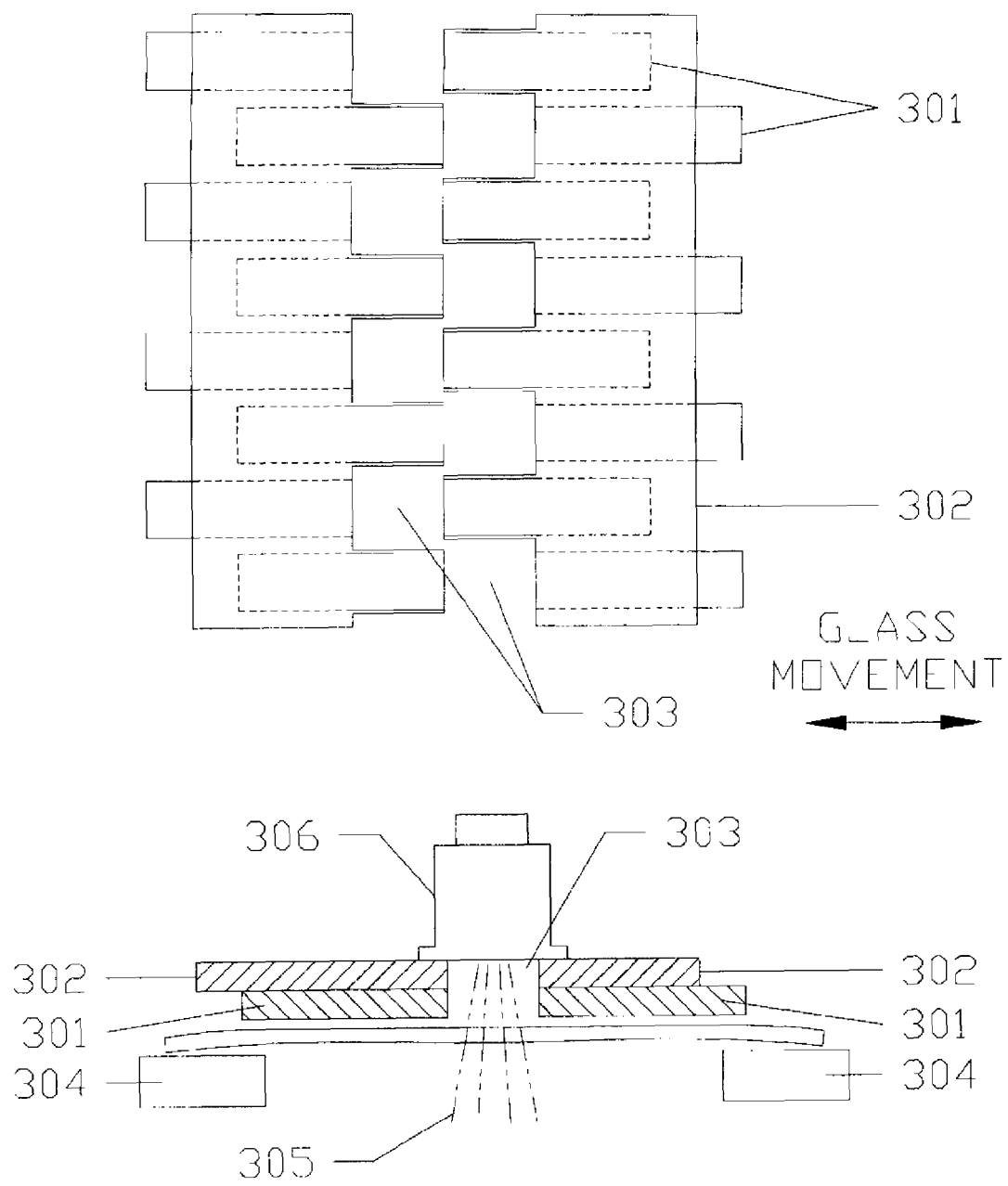
FIG. 3 shows another glass flattening embodiment.

FIG. 3 is a representation of an embodiment for lithography or optical inspection with source 306 which may be attached to an intermediary structure 302 or directly to the precision chucks 301. In this case apertures of different sizes 303 like; 100 mm by 100 mm, 150 mm by 150 mm or 200 mm by 250 mm as examples, are surrounded by precision air bearing vacuum preloaded chucks 301. These bearings will have the effect of flattening the glass. More effective flattening and transfer can be achieved by alternating the exposure zones 303. This embodiment is a partial plain view of the profile view shown in FIG. 1A but shows a larger aperture through the lower supporting conveyors 304 for any radiation 305 or heat to move away.

While various preferred embodiments of the present invention have been set forth in detail, those skilled in the art who have reviewed the present disclosure will readily appreciate that other embodiments can be realized within the scope of the invention. For example, numerical values are illustrative rather than limiting, as are disclosures of specific materials. Also, any features from one embodiment can be incorporated into any other embodiment wherever appropriate. Therefore, the present invention should be construed as limited only by the appended claims.

I claim:

1. A method for locally flattening natural thickness errors of glass, the method comprising:
    (a) providing vacuum preloaded air bearings, arrayed around or near to an area of the glass to be flattened;
    (b) positioning the glass with the side of the glass to be flattened facing the air bearings; and
    (c) supporting the glass with the vacuum preloaded air bearings to flatten the side of the glass to be flattened by causing the natural thickness errors to move from the side of the glass to be flattened to the opposite side of the glass, the natural thickness errors being in a range from 5 to 7 microns.

2. A method as claimed in claim 1, further comprising (d) processing a portion of the flattened side of the glass by; patterning with light, laser, ink, physical imprinting; inspecting, scanning, repairing or coating for manufacturing electronic circuits.

3. A method as claimed in claim 2, wherein the glass moves relative to the bearings and processing, parallel to the face of the bearings in the X and or Y direction.

4. A method as claimed in claim 2, wherein the bearings and the processing move relative to the glass in the X and or Y direction.

* * * * *